(12) United States Patent
De Silva et al.

(10) Patent No.: US 10,254,652 B2
(45) Date of Patent: Apr. 9, 2019

(54) APPROACH TO LOWERING EXTREME ULTRAVIOLET EXPOSURE DOSE FOR INORGANIC HARDMASKS FOR EXTREME ULTRAVIOLET PATTERNING

(71) Applicant: INTERNATIONAL BUSINESS MACHINES CORPORATION, Armonk, NY (US)

(72) Inventors: Ekmini A. De Silva, Slingerlands, NY (US); Karen E. Petrillo, Voorheesville, NY (US); Indira P. Seshadri, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/050,866

(22) Filed: Jul. 31, 2018

(65) Prior Publication Data

US 2018/0348636 A1 Dec. 6, 2018

Related U.S. Application Data

(63) Continuation of application No. 15/406,327, filed on Jan. 13, 2017, now Pat. No. 10,082,736.

(51) Int. Cl.
| | |
|---|---|
| *G03F 7/004* | (2006.01) |
| *G03F 7/16* | (2006.01) |
| *B82Y 40/00* | (2011.01) |
| *H01L 21/3213* | (2006.01) |
| *G03F 7/20* | (2006.01) |
| *H01L 21/027* | (2006.01) |
| *G03F 7/09* | (2006.01) |
| *G03F 7/11* | (2006.01) |

(52) U.S. Cl.
CPC .............. *G03F 7/165* (2013.01); *B82Y 40/00* (2013.01); *G03F 7/094* (2013.01); *G03F 7/11* (2013.01); *G03F 7/168* (2013.01); *G03F 7/2004* (2013.01); *G03F 7/2037* (2013.01); *H01L 21/0274* (2013.01); *H01L 21/0276* (2013.01); *H01L 21/32139* (2013.01)

(58) Field of Classification Search
CPC .......... G03F 7/004; G03F 7/2037; G03F 7/11; G03F 7/165; G03F 7/094; H01L 21/0274; H01L 21/0276; H01L 21/32139; B82Y 40/00
USPC ....... 430/270.1, 271.1, 273.1, 311, 322, 325, 430/329, 300, 331
See application file for complete search history.

(56) References Cited

U.S. PATENT DOCUMENTS

| | | | |
|---|---|---|---|
| 7,736,833 B2 | 6/2010 | Angelopoulos et al. | |
| 8,257,910 B1 | 9/2012 | Guerrero et al. | |
| 8,759,220 B1 | 6/2014 | Ogihara et al. | |

(Continued)

OTHER PUBLICATIONS

Grenville, et al., "Integrated Fab Process for Metal Oxide EUV Photoresist", SPIE Advanced Lithography Conference 2015. Feb. 22, 2015. Proceedings vol. 9425. pp. 1-8.

(Continued)

*Primary Examiner* — Amanda C. Walke
(74) *Attorney, Agent, or Firm* — Tutunjian & Bitetto, P.C.; Vazken Alexanian

(57) ABSTRACT

An extreme ultraviolet lithography pattern stack, including, an inorganic hardmask layer, an under layer on the inorganic hardmask layer, and a resist layer on the under layer, where the inorganic hardmask layer, under layer, and resist layer have a combined thickness in the range of about 8.5 nm to about 70 nm.

20 Claims, 2 Drawing Sheets

(56) References Cited

U.S. PATENT DOCUMENTS

| | | | |
|---|---|---|---|
| 8,945,820 B2 | 2/2015 | Ogihara et al. | |
| 8,968,989 B2 | 3/2015 | Ouattara et al. | |
| 9,063,420 B2 | 6/2015 | Ober et al. | |
| 9,337,052 B2 | 5/2016 | Shigaki et al. | |
| 2004/0203256 A1 | 10/2004 | Yang et al. | |
| 2014/0091379 A1 | 4/2014 | Tang et al. | |
| 2016/0116839 A1 | 4/2016 | Meyers et al. | |
| 2016/0179005 A1 | 6/2016 | Shamma et al. | |

OTHER PUBLICATIONS

Li et al., "A Chemical Underlayer Approach to Mitigate Shote Noise in EUV Contact Hole Patterning", SPIE Proceedings. vol. 9051. Mar. 27, 2014. pp. 1-11.

Padmanaban et al., "Progress in Spin-on Hard Mask Materials for Advanced Lithography", Journal of Photopolymer Science and Technology. vol. 27, No. 4. Mar. 20, 2015. pp. 503-509.

Stowers et al., "Directly Patterned Inorganic Hardmask for EUV Lithography", SPIE 7969, Extreme Ultraviolet (EUV) Lithography II. vol. 7969. Apr. 7, 2011. pp. 1-11.

List of IBM Patents or Patent Applications Treated as Related dated Jul. 31, 2018, 2 pages.

APPROACH TO LOWERING EXTREME ULTRAVIOLET EXPOSURE DOSE FOR INORGANIC HARDMASKS FOR EXTREME ULTRAVIOLET PATTERNING

BACKGROUND

Technical Field

The present invention generally relates to a pattern stack for extreme ultraviolet (EUV) lithography, and more particularly to a multi-layer stack including a fast-etching under layer between an organic resist and inorganic hardmask for pattern transfer.

Description of the Related Art

Semiconductor fabrication typically involves transfer of a pattern from a mask to a resist using lithography, and transfer of the pattern from the resist to a hardmask through etching. The pattern can then be transferred from the hardmask to a semiconductor material through further etching processes. In general, photolithography (in contrast to e-beam lithography, for example) uses light to form an image of the mask on a photoresist material, where the incident light can cause a photo reaction. Light for photolithography has progressed from wavelengths in the range of 436 nm (blue light) to 365 nm (near ultraviolet (UV)) to 248 nm (deep UV) to a wavelength of 193 nm. The wavelength of light has moved to smaller and smaller wavelengths in part because the smallest feature size that can be printed is determined in part by the wavelength, $\lambda$, of the light used. Another factor that can affect the smallest printed feature size is the numerical aperture, NA, of the projection optics. The depth-of-focus (DOF) is also determined by $\lambda$ and the numerical aperture NA, which is also typically a factor in resolving small features. The DOF can relate to a visible change in the image related to exposure dose, line width, sidewall angle, and resist loss. As feature sizes decrease, their sensitivity to focus errors increases.

In extreme ultraviolet lithography (EUVL) the extreme ultraviolet light (which also may be referred to as soft x-ray) has wavelengths from 124 nm down to 10 nm, and in particular for intended semiconductor processing, about 13.5 nm, as generated by a laser-pulsed tin (Sn) plasma source. The 13.5 nm EUV light is currently the focus of the next generation of photolithography tools and processes.

An original image of the features to be formed on a substrate are typically written on a lithography mask, unlike previous longer wavelength light used for lithography, however, EUV light is strongly absorbed by almost all materials. Transmission (i.e., refractive) masks, therefore, cannot be used, and approaches using reflective components for the optics and mask are instead being developed. A mask for EUV lithography (EUVL) can involve a multi-layer tuned to 13.5 nm, where the multilayer mask includes an absorber to produce dark areas. The photomask used for EUV lithography can include alternating molybdenum and silicon layers.

In addition, the image of the mask features are intended to be transferred to a photoresist on the substrate. In the past photoresists have been positive resists in which the exposed area is made soluble in the developer or negative resists in which the exposed area is made insoluble to the developer, however, the physical characteristics of the EUV light has also altered the types and arrangements of materials that can be used to form the photoresist.

As the wavelength of light becomes smaller, new photoresist materials are also needed. Photoresist material are typically sensitive at the wavelength of light used to image the mask. This can involve using chemical sensitizers (e.g., photo-acid generators) to increase sensitivity, since light intensities may be less than previously achieved. Photoresist materials should also be resistant to the etching environment used to transfer the pattern from the photoresist to the hardmask.

SUMMARY

In accordance with an embodiment of the present invention, an extreme ultraviolet lithography pattern stack, including, an inorganic hardmask layer, an under layer on the inorganic hardmask layer, and a resist layer on the under layer, where the inorganic hardmask layer, under layer, and resist layer have a combined thickness in the range of about 8.5 nm to about 70 nm is provided.

In accordance with another embodiment of the present invention, an extreme ultraviolet lithography pattern stack, including, an inorganic hardmask layer, an under layer directly on the inorganic hardmask layer, where the under layer is a polymeric layer or a self-assembled monolayer, and a resist layer on the under layer is provided.

In accordance with yet another embodiment of the present invention, a method of forming an extreme ultraviolet lithography pattern stack, including, forming an organic planarization layer on a substrate, forming an inorganic hardmask layer directly on the organic planarization layer, forming an under layer directly on the inorganic hardmask layer, where the under layer is a polymeric layer or a self-assembled monolayer, and forming a resist layer directly on the under layer is provided.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
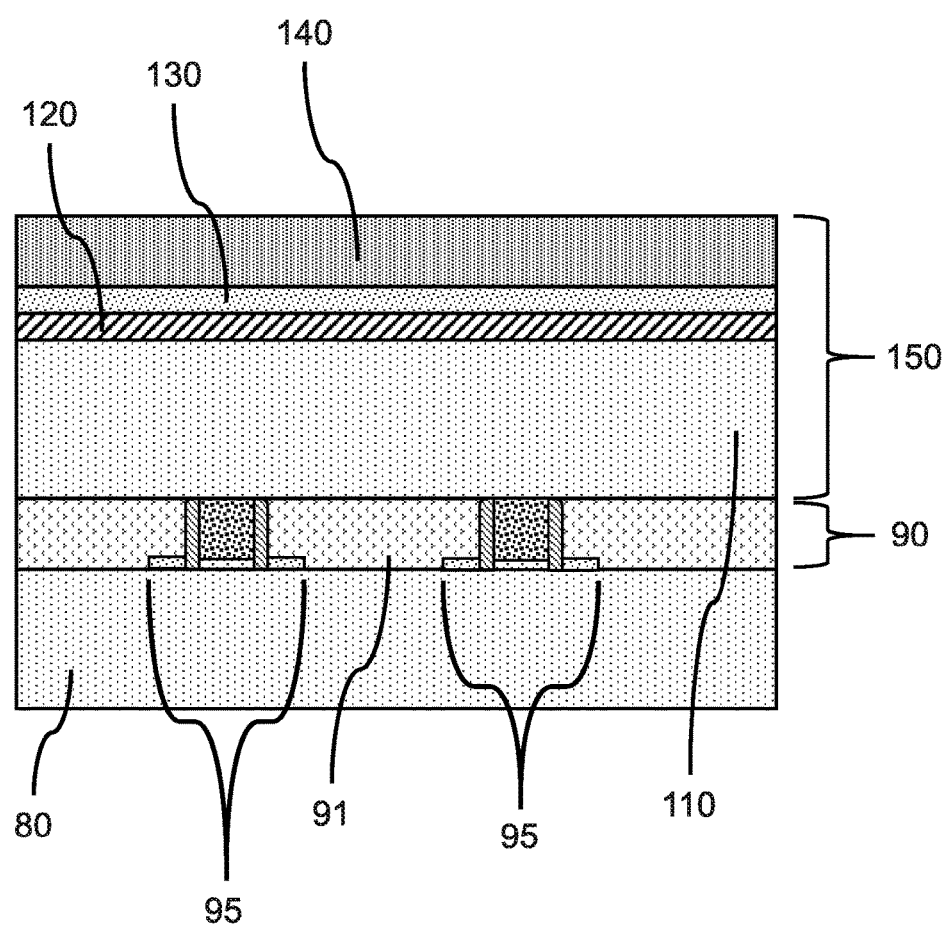
FIG. 1 is a cross-sectional view showing a cross-sectional side view of a pattern stack, in accordance with an embodiment of the present invention.

Principles and embodiments of the present invention also relate generally to fabricating microelectronics structures, and the resulting structures formed thereby, using extreme ultraviolet (EUV) lithographic processes utilizing a three layer pattern stack.

Principles and embodiments of the present invention also relate generally to changing the layers in a EUV lithographic pattern stack, including an inorganic hardmask and an organic resist layer, to maintain or reduce the amount of EUV light utilized to achieve a full exposure of the organic resist layer. Provided is an alternate EUV pattern stack including an inorganic hardmask, an organic resist layer, and an organic under layer between them. The under layer can be a spin-on layer or a self-assembled monolayer that acts as a barrier between the inorganic hardmasks and the resist layer in order to lower the dose of light used. The under layer can reduce or avoid neutralization of sensitizers and generated reactive intermediaries in the resist layer due to interaction with the hardmask material.

Principles and embodiments of the present invention relate generally to including a thin, fast-etching under layer on an inorganic hardmask of the pattern stack, where the under layer acts to reduce the light dose needed to expose the resist material without sacrificing etch selectivity when scaled to sub-50 nm length scales. Fast etching can provide for transfer of patterns to the inorganic hardmask layer without loss of feature resolution or resist thickness.

Principles and embodiments of the present invention relate to having a thin, fast etching under layer on top of an inorganic hardmask to form a three-layer stack, where reduced critical dimensions (e.g., line widths) can be achieved with improved dose-to-size ratios, while improving adhesion and reducing or eliminating pattern collapse issues.

Principles and embodiments of the present invention also relate to a quad stack having a <10 nm organic layer between an inorganic hardmask and photoresist to reduce EUV dose, and an organic planarization layer beneath the inorganic hardmask. An EUV patterning stack can have a silicon or transition metal based hardmask as the etch transfer layer, and a thin (<10 nm) fast etching organic under layer as a method to lower EUV dose to size in <50 nm pitch. An EUV patterning stack can have transition metal hardmasks as an etch transfer layer, and a self-assembled monolayer as a barrier between resist and transition metal hardmask, which can lower the EUV dose to size in <50 nm pitch. Increased sensitivity of the pattern stack reduces the need for higher power light sources. Sensitivity is typically defined in terms of mJ/cm$^2$.

The depth of penetration of the EUV light into a resist layer can be about 200 nm. The EUV light used (e.g., 13.5 nm) for exposure tends to have fewer photons than the light previously used at longer wavelengths.

Acid diffusion can be a limiting factor in resolution of a resist, where increased diffusion of the acid causes feature broadening. Line edge roughness (LER) is influenced by shot noise. Sensitivity can be inversely proportional to line edge roughness, so higher sensitivity can lead to greater LER.

Exemplary applications/uses to which the present invention can be applied include, but are not limited to: digital logic devices (e.g., AND gates, NAND gates, NOR gates, etc.), and memory devices (e.g., SRAM, DRAM, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a pattern stack is shown, in accordance with an embodiment of the present invention.

In one or more embodiments, a pattern stack 150 is formed on an underlying substrate 80, which may have previously formed device features in a feature stack layer 90, that can include an interlayer dielectric 91. The device features can include a plurality of partially fabricated semiconductor devices 95 that can subsequently form a completed device. The device features can include, but are not limited to, sources, drains, channels, gates, fins, contacts, as well as, other conductive (e.g., lines, vias), resistive (e.g., resistors), insulating (e.g., shallow trench isolation regions, buried oxide layers), and semiconductor layers and components (e.g., capacitive and inductive components).

In one or more embodiments, a substrate 80 can be a semiconductor or an insulator with an active surface semiconductor layer. The substrate 80 can include a carrier layer that provides structural support to other thinner layers. The substrate 80 can include crystalline, semi-crystalline, micro-crystalline, or amorphous regions. The substrate 80 can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides.

In one or more embodiments, the substrate 80 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In various embodiments, front-end-of-line processes, including, but not limited to, masking, developing, etching, depositing, and epitaxial growth, may already have been performed on the substrate 80 to fabricate partial devices 95, such as transistors (e.g., FinFETs, MOSFETS, etc.) for logic and memory devices prior to subsequent lithographic steps using EUV light and a pattern stack 150.

In one or more embodiments, an organic planarization layer 110 (OPL) can be formed on the device feature stack 90, where the OPL can fill in gaps and spaces between and around the partially fabricated device features previously formed on the substrate 80.

In one or more embodiments, the organic planarization layer 110 can be a flowable oxide, a spin-on-carbon (SOC), a low-k dielectric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methyl-silsesquioxane (MSQ)), or combinations thereof. In various embodiments, the OPL 110 can be formed by CVD, LPCVD, or spun on.

In one or more embodiments, the organic planarization layer 110 can have a thickness in the range of about 20 nm to about 150 nm, or in the range of about 30 nm to about 100 nm, or in the range of about 30 nm to about 75 nm, where the thickness of the organic planarization layer 110 can be sufficient to cover the device features formed in the device feature stack 90. The OPL 110 can provide a flat, uniform surface for formation of a hardmask layer.

In one or more embodiments, an inorganic hardmask layer 120 can be formed on the organic planarization layer 110, where the inorganic hardmask layer 120 can be formed by CVD, PECVD, PVD, or a combination thereof.

In one or more embodiments, the inorganic hardmask layer 120 can have a thickness in the range of about 3 nm to about 10 nm, or in the range of about 4 nm to about 8 nm.

In one or more embodiments, the inorganic hardmask layer 120 can be a silicon-containing material, a metal oxide ($MO_x$), a metal nitride ($MN_x$), a metal carbide ($MC_x$), or combinations thereof. The metal oxide can be a transition metal oxide. The metal nitride can be a transition metal nitride. The metal carbide can be a transition metal carbide. Examples of the silicon-containing material include, but are not limited to, a silicon oxide (SiO), a silicon nitride (SiN), a silicon oxynitride (SiON), a silicon carbonitride (SiCN), a silicon boronitride (SiBN), a silicon borocarbide (SiBC), and a silicon boro carbonitride (SiBCN). Examples of the metal oxide include, but are not limited to titanium oxide ($TiO_x$), molybdenum oxide ($MoO_x$), and hafnium oxide ($HfO_x$). Examples of the metal nitride include, but are not limited to titanium nitride ($TiN_x$), molybdenum nitride ($MoN_x$), and tantalum nitride ($TaN_x$). Examples of the metal carbide include, but are not limited to titanium carbide ($TiC_x$) and tantalum carbide ($TaC_x$).

In one or more embodiments, an under layer 130 can be formed on the hardmask 120, where the under layer 130 can be an organic polymer layer or a self-assembled monolayer (SAM). The under layer 130 can be spun on or self-assembled on the surface sites of the inorganic hardmask layer 120. In various embodiments, the under layer 130 does not include photoacid generators (PAGs).

In one or more embodiments, an under layer 130 can have a thickness in the range of about 1 monolayer to about 10 monolayers, or in the range of about 4 monolayers to about 8 monolayers, where the under layer 130 is sufficiently thick to avoid pinholes. In various embodiments, the under layer 130 can have a thickness in the range of about 0.5 nm to about 10 nm, about 0.5 nm to about 5 nm, about 0.5 nm to about 2 nm, or about 0.5 nm to about 1 nm. The under layer 130 can increase the adhesion of a subsequently formed resist layer 140 to the underlying hardmask layer 120 to reduce pattern collapse and form a barrier to diffusion of acidic and basic molecules and moieties, including, for example, sulfonium and iodonium based acid molecules. The under layer 130 can be a fast etching material to allow transfer of a resist pattern from the resist layer 140 to the hardmask layer 120 without resulting resist erosion and/or feature broadening.

In various embodiments, the under layer 130 can reduce or prevent photo reactive components in the resist layer 140 from interacting with the inorganic hardmask layer 120, and thereby being deactivated. The under layer 130 can reduce the dose needed by the resist layer by about 20% to about 30%, where a baseline dose for a resist layer directly on a SiARC layer can be 30 mJ/cm$^2$, and a baseline dose for a resist layer directly on a metal-containing hardmask layer can be 40 mJ/cm$^2$. An EUV dose on a metal hardmask can be about 10 mJ higher than for a photoresist on a silicon anti reflection coating (SiARC).

In various embodiments, the under layer 130 can increase the adhesion of the resist layer to >0 for a resist material that would have an adhesion of 0 directly to a metal hardmask (i.e., would spontaneously delaminate).

In one or more embodiments, the under layer 130 can be a poly ethyl-vinyl alcohol or poly methyl methacrylate (PMMA), where the polymer does not include aromatic moieties (e.g., 5 or 6 member aromatic rings, (e.g., benzyl), etc.).

In one or more embodiments, the polymeric under layer 130 does not include aromatic ring structures, for example, benzyl pendent groups off of the polymer backbone, so the under layer 130 is fast etching. In various embodiments, the polymeric under layer 130 does not include silane groups (—Si(OR)$_3$, where R can be hydrogen or a C$_1$-C$_4$ alkyl chain). A fast-etching underlayer can have an etching rate that is about 10× to about 100× faster etching, or about 50× to about 100× faster etching, than the material of the resist layer 140, where etching rate can be measured in thickness (e.g. nanometers (nm)) removed per unit of time (e.g., seconds, minutes). For example, a fast etching under layer may be removed at a rate of about 500 nm per minute compared to a resist layer 140 having an etching rate of about 10 nm per minute for a predetermined etching process/chemistry.

In one or more embodiments, the self-assembled monolayer can include surface active agents (surfactants), where the surface active agents have a hydroxyl (—OH) head and an alky tail with a C$_6$ to C$_{18}$ carbon chain length, a sulfonic acid (—SO$_3$H) head and an alky tail with a C$_6$ to C$_{18}$ carbon chain length, or phosphonic acid (—PO(—OR$_1$)(—OR$_2$)) head, where R$_1$ and R$_2$ are alky tails with a C$_6$ to C$_{18}$ carbon chain length. The alkyl tail, R$_1$, can have the same chain length as alkyl tail, R$_2$, or alkyl tail, R$_1$, can have a different chain length than alkyl tail R$_2$. In various embodiments, the surface active agents do not include a benzyl (—C$_6$H$_4$—) or cycloalkyl (e.g., —C$_6$H$_{10}$—) ring in the molecular structure. In various embodiments, the alky tail(s) do not include alkyl side groups (i.e., branch chains) or other functional groups (e.g., hydroxy (—OH), carbonyl (—CO—), ethoxy (R—O—R), etc.). In various embodiments, the self-assembled monolayer does not include silane groups. The hydroxyl (—OH), sulfonic acid (—SO$_3$H), or phosphonic acid (—PO(—OR$_1$)(—OR$_2$)) head can bind to an oxide surface or inorganic surface site of the hardmask layer 120, and the C$_6$ to C$_{18}$ alky tail can interact (e.g., dipole interaction, chain entanglement, etc.) with a resist layer 140. In various embodiments, the surface active agent with a hydroxy head group is not an aliphatic alcohol ethoxylate (AE).

In one or more embodiments, a resist layer 140 can be formed on the under layer 130, where the resist layer 140 can be a photoresist that is sensitive to EUV light, for example, an organic photoresist. The resist layer 140 can be formed by LPCVD or spun-on. In various embodiments, the resist layer 140 include PAGs to increase sensitivity. The resist layer can be a negative resist or a positive resist.

In one or more embodiments, the resist layer 140 can have a thickness in the range of about 5 nm to about 50 nm, or in the range of about 5 nm to about 25 nm, or in the range of about 8 nm to about 15 nm.

In one or more embodiments, the resist layer 140, under layer 130, and hardmask layer 120, forms the pattern stack 150, where the pattern stack can have a combined thickness in the range of about 8.5 nm to about 70 nm, or in the range of about 9 nm to about 61 nm, or in the range of about 9 nm to about 35 nm, or in the range of about 14.5 nm to about 22 nm. The pattern stack for EUV can have a low aspect ratio for sub 36 nm pitch single exposure imaging of an inorganic hardmask including silicon or a transition metal (e.g., Ti, Ta, Hf, Mo, etc.).

In one or more embodiments, the pattern stack 150 can have a low aspect ratio, where the thickness (i.e., height) of the pattern stack 150 can be about 5× the intended lateral feature dimension, or 2× the intended lateral feature dimension, or 1× the intended lateral feature dimension to be formed in the resist layer 140. The depth-of-focus can be under 50 nm for the under layer 130. This thin under layer 130 can help to lower the dose, while not sacrificing etch selectivity, as it can be etched fast during inorganic hardmask etching/patterning, which can be applied to a sub 50 nm length scale.

In various embodiments, the feature sizes formed in the resist layer can have less than a 50 nm lateral dimension, or can be in the range of about 10 nm to about 50 nm, or in the range of about 10 nm to about 30 nm.

In one or more embodiments, the pattern stack 150 can undergo a post exposure bake after EUV exposure of the resists layer 140.

Figure 2:
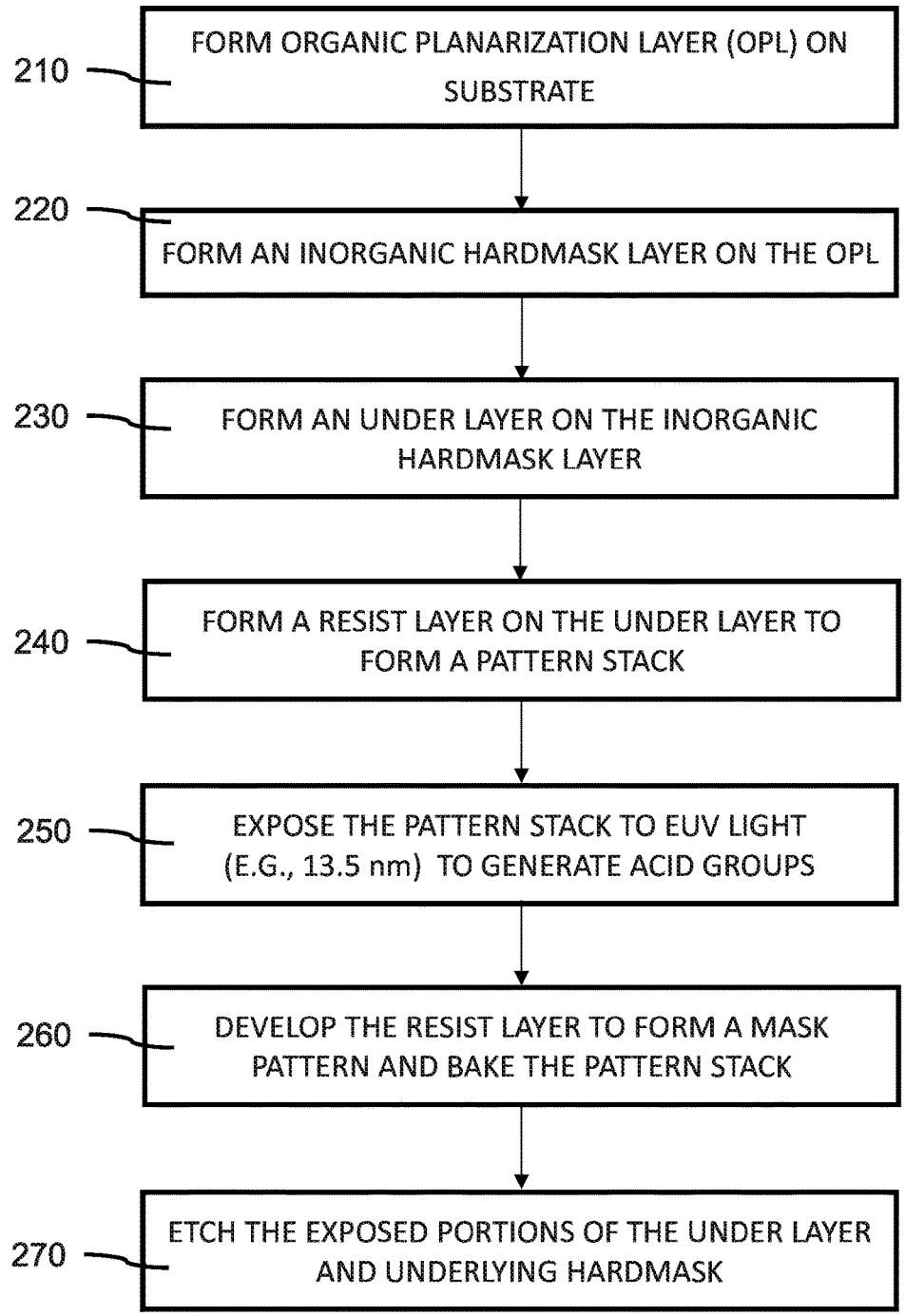
FIG. 2 is a block/flow diagram of a method of preparing and patterning a pattern stack.

FIG. 2 is a block/flow diagram of a method of preparing and patterning a pattern stack.

In block 210, an organic planarization layer (OPL) can be formed on a substrate, where device components and an interlayer dielectric (ILD) layer may have been previously formed on the substrate. The OPL can cover the device features and ILD layer and be chemically-mechanically polished to provide a smooth, flat surface.

In block 220, and inorganic hardmask can be formed on the OPL, where the inorganic hardmask can be deposited directly on the exposed surface of the OPL. The hardmask can provide chemical resistance and etch selectivity for subsequent etching processes, for example, by reactive ion etching, that can transfer a pattern from a resist layer to the inorganic hardmask. The inorganic hardmask can include silicon and transition metal compounds, for example, oxides, carbides, and nitrides, which may be stoichiometric or non-stoichiometric.

In block 230, an under layer can be formed on the hardmask layer, where the under layer can be directly on the hardmask layer and bind to the surface of the hardmask layer. The under layer can be an organic polymer or an organic self-assembled monolayer that binds to surface sites of the hardmask layer. In various embodiments, a polar head group of the surface active agents forming a self-assembled monolayer can chemisorb to surface cites of the hardmask layer.

In block 240 a resist layer can be formed on the under layer, where the resist layer can be directly on the under layer, and bind to the under layer through surface attraction (e.g., physisorption, dipole attraction, etc.). The resist layer can be a photoresist layer that includes photo acid generators (PAGs), and may undergo photoreactions when exposed to EUV light, where the EUV light can have a wavelength of 13.5 nm. The depth of focus for patterning feature sizes in the 20-50 nm range can be increased by 2× due to the addition of the under layer 130. The under layer 130 can provide improved pattern fidelity, hence, the focus window can be improved. If the adhesion is poor, the resist pattern can fail, so there is no pattern at all, or even a slight defocus can lift off the pattern.

The resist layer 140, under layer 130, and hardmask layer 120 can form a pattern stack on the OPL and substrate. The underlayer can increase the adhesion of the resist layer to the hardmask layer by 10% to 30%.

In block 250, the pattern stack can be exposed to EUV light, where the EUV light can have a pattern introduced by an EUV lithography mask. The EUV light can activate the PAGs in the portions of the resist layer exposed to the EUV light. The PAGs may cause cross-linking (for a negative resist) or bond breaking (for a positive resist) in the exposed portions of the resist layer, depending on whether the resist layer is a positive-tone or negative tone resist.

In block 260, the resist can be developed and rinsed to remove the soluble portions of the resist layer. A mask pattern of the resist can remain on the under layer after rinsing, where the under layer can assist in preventing pattern collapse of the mask pattern in the resist layer. Pattern collapse may be prevented by the additional adhesive strength between the resist layer and under layer, and lower aspect ratio of the resist layer. The improved adhesion between the resist layer and hardmask can also prevent delamination of the resist layer with the mask pattern.

In block 270, the pattern stack with the mask pattern in the resist layer can undergo a post exposure bake to degas and densify the resist layer and under layer.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An extreme ultraviolet lithography pattern stack, comprising:
   an inorganic hardmask layer, wherein the inorganic hardmask layer is a silicon-containing material, a metal oxide ($MO_x$), a metal nitride ($MN_x$), a metal carbide ($MC_x$), or combinations thereof;
   an under layer on the inorganic hardmask layer, wherein the under layer is a polymeric layer; and
   a resist layer on the under layer, wherein the resist layer is sensitive to extreme ultraviolet light with a wavelength of about 13.5 nm.

2. The extreme ultraviolet lithography pattern stack of claim 1, wherein the under layer has a thickness in the range of about 0.5 nm to about 10 nm.

3. The extreme ultraviolet lithography pattern stack of claim 2, wherein the inorganic hardmask layer has a thickness in the range of about 3 nm to about 10 nm.

4. The extreme ultraviolet lithography pattern stack of claim 3, wherein the resist layer has a thickness in the range of about 5 nm to about 50 nm.

5. The extreme ultraviolet lithography pattern stack of claim 4, wherein the inorganic hardmask layer, under layer, and resist layer have a combined thickness in the range of about 8.5 nm to about 70 nm.

6. The extreme ultraviolet lithography pattern stack of claim 5, wherein the resist layer includes photoacid generators (PAGs).

7. The extreme ultraviolet lithography pattern stack of claim 1, further comprising an organic planarization layer having a thickness in the range of about 20 nm to about 150 nm, where the inorganic hardmask layer is on the organic planarization layer.

8. The extreme ultraviolet lithography pattern stack of claim 7, wherein the under layer is a self-assembled monolayer.

9. The extreme ultraviolet lithography pattern stack of claim 8, wherein the self-assembled monolayer is formed by surface active agents with a hydroxyl (—OH) head and an alky tail with a $C_6$ to $C_{18}$ carbon chain length, a sulfonic acid (—$SO_3H$) head and an alky tail with a $C_6$ to $C_{18}$ carbon chain length, or phosphonic acid (—PO(—$OR_1$)(—$OR_2$)) head, where $R_1$ and $R_2$ are alky tails with a $C_6$ to $C_{18}$ carbon chain length, where $R_1$ has the same chain length as $R_2$ or $R_1$ has a different chain length than $R_2$.

10. An extreme ultraviolet lithography pattern stack, comprising:
an inorganic hardmask layer;
an under layer directly on the inorganic hardmask layer, where the under layer is a self-assembled monolayer; and a resist layer on the under layer, wherein the resist layer is sensitive to extreme ultraviolet light with a wavelength of about 13.5 nm.

11. The extreme ultraviolet lithography pattern stack of claim 10, wherein the self-assembled monolayer is formed by surface active agents with a hydroxyl (—OH) head and an alky tail with a $C_6$ to $C_{18}$ carbon chain length, a sulfonic acid (—$SO_3H$) head and an alky tail with a $C_6$ to $C_{18}$ carbon chain length, or phosphonic acid (—PO(—$OR_1$)(—$OR_2$)) head, where $R_1$ and $R_2$ are alky tails with a $C_6$ to $C_{18}$ carbon chain length, where $R_1$ has the same chain length as $R_2$ or $R_1$ has a different chain length than $R_2$.

12. The extreme ultraviolet lithography pattern stack of claim 11, wherein the resist layer is directly on the under layer.

13. The extreme ultraviolet lithography pattern stack of claim 12 layer, wherein the inorganic hardmask layer is made of a material selected from the group consisting of silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), titanium oxide (TiO), molybdenum oxide ($MoO_x$), hafniun oxide ($HfO_x$), titanium nitride ($TiN_x$), molybdenum nitride ($MoN_x$), tantalum nitride ($TaN_x$), titanium carbide ($TiC_x$), and tantalum carbide ($TaC_x$).

14. The extreme ultraviolet lithography pattern stack of claim 13, wherein the under layer is a fast etching polymeric layer that can allow transfer of resist patterns to the inorganic hardmask layer without loss of feature resolution or resist thickness.

15. A method of forming an extreme ultraviolet lithography pattern stack, comprising:
forming an inorganic hardmask layer on a substrate, wherein the inorganic hardmask layer is a metal oxide ($MO_x$), a metal nitride ($MN_x$), a metal carbide ($MC_x$), or combinations thereof;
forming an under layer directly on the inorganic hardmask layer, where the under layer is a polymeric layer or a self-assembled monolayer; and
forming a resist layer directly on the under layer, wherein the resist layer is sensitive to extreme ultraviolet light with a wavelength of about 13.5 nm.

16. The method of claim 15, wherein the under layer is a self-assembled monolayer, and the self-assembled monolayer is formed by surface active agents with a hydroxyl (—OH) head and an alky tail with a $C_6$ to $C_{18}$ carbon chain length, a sulfonic acid (—$SO_3H$) head and an alky tail with a $C_6$ to $C_{18}$ carbon chain length, or phosphonic acid (—PO(—$OR_1$)(—$OR_2$)) head, where $R_1$ and $R_2$ are alky tails with a $C_6$ to $C_{18}$ carbon chain length, where $R_1$ has the same chain length as $R_2$ or $R_1$ has a different chain length than $R_2$.

17. The method of claim 15, wherein the inorganic hardmask layer has a thickness in the range of about 3 nm to about 10 nm.

18. The method of claim 17, wherein the under layer is a fast etching polymeric layer with a thickness in the range of about 0.5 nm to about 10 nm.

19. The method of claim 15, wherein the underlayer does not include photoacid generators.

20. The method of claim 19, the inorganic hardmask layer, under layer, and resist layer have a combined thickness in the range of about 9 nm to about 35 nm.

* * * * *